(12) United States Patent
Kunnen et al.

(10) Patent No.: US 10,128,124 B2
(45) Date of Patent: Nov. 13, 2018

(54) METHOD FOR BLOCKING A TRENCH PORTION

(71) Applicant: IMEC VZW, Leuven (BE)

(72) Inventors: Eddy Kunnen, Sint-Joris-Winge (BE); Steven Demuynck, Aarschot (BE); Jürgen Bömmels, Leuven (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 14/964,406

(22) Filed: Dec. 9, 2015

(65) Prior Publication Data

US 2016/0172194 A1    Jun. 16, 2016

(30) Foreign Application Priority Data

Dec. 15, 2014 (EP) ..................... 14197994

(51) Int. Cl.
*H01L 21/311* (2006.01)
*H01L 21/768* (2006.01)

(52) U.S. Cl.
CPC .. *H01L 21/31144* (2013.01); *H01L 21/76816* (2013.01)

(58) Field of Classification Search
CPC .......... H01L 21/0332; H01L 21/31144; H01L 21/31116; H01L 21/02282; H01L 21/02115; H01L 21/0337; H01L 21/033; H01L 23/53238; H01L 23/53266; H01L 21/31138; H01L 21/76804; H01L 21/76843; H01L 21/76
USPC ................. 257/618, 773; 438/702, 694, 666
See application file for complete search history.

(56) References Cited

U.S. PATENT DOCUMENTS

| 8,298,943 | B1 | 10/2012 | Arnold et al. |
| 8,470,711 | B2 | 6/2013 | Arnold et al. |
| 2002/0072198 | A1* | 6/2002 | Ahn .................. H01L 21/76224 438/424 |
| 2008/0032508 | A1 | 2/2008 | Chang |
| 2008/0085472 | A1 | 4/2008 | Youn |
| 2008/0200035 | A1 | 8/2008 | Jung |
| 2013/0037918 | A1 | 2/2013 | Chen |
| 2014/0193980 | A1 | 7/2014 | Lee et al. |
| 2014/0199832 | A1* | 7/2014 | Nguyen ............ H01L 21/02244 438/637 |
| 2014/0242799 | A1 | 8/2014 | Takakua et al. |

(Continued)

*Primary Examiner* — Mouloucoulaye Inoussa
(74) *Attorney, Agent, or Firm* — Knobbe Martens Olson & Bear, LLP

(57) ABSTRACT

A method is provided for blocking a portion of a longitudinal through-hole during manufacture of a semiconductor structure, comprising the steps of: forming a stack comprising a hard mask comprising at least one trench, and a first coating filling the at least one trench and coating the hard mask, wherein the first coating comprises one or more materials that can be etched selectively with respect to a second coating; etching at least one vertical via in the first coating directly above the portion of the trench in such a way as to remove the first coating over at least a fraction of the depth of the trench, filling the at least one via with the second coating material, and removing the first coating selectively with respect to the second coating from at least the one or more longitudinal through-holes in such a way as to leave in place any of the first coating present directly underneath the second coating.

14 Claims, 16 Drawing Sheets

(56) References Cited

U.S. PATENT DOCUMENTS

2015/0262864 A1* 9/2015 Okamoto .......... H01L 21/31116
438/671
2016/0027785 A1* 1/2016 Fujimoto .......... H01L 27/10814
257/330

* cited by examiner

METHOD FOR BLOCKING A TRENCH PORTION

INCORPORATION BY REFERENCE TO RELATED APPLICATIONS

Any and all priority claims identified in the Application Data Sheet, or any correction thereto, are hereby incorporated by reference under 37 CFR 1.57. This application claims the benefit of European Application No. EP 14197994.8 filed Dec. 15, 2014. The aforementioned application is incorporated by reference herein in its entirety, and is hereby expressly made a part of this specification.

FIELD OF THE INVENTION

Methods for forming connecting lines in semiconductor devices, and semiconductor devices comprising such connecting lines, are provided.

BACKGROUND OF THE INVENTION

In the manufacture of semiconductor devices, especially on advanced nodes, most of the Back End Of Line (BEOL) layers need to be patterned by multiple lithographic exposure (L) and etch (E) sequences due to limitations in lithographic printability at dense pitch. For this reason, forming connection lines of well-defined length becomes very challenging. A typical sequence for the formation of such connection lines starts by forming trenches in a hard mask (in multiple LE sequences), followed by defining interruptions to those trenches. At dense pitch also these interruptions do require multiple LE sequences. A major issue with this method is that the number of layers in the hard mask stack increases with the number of layers required to define the blocked portions. If more than one lithographic mask must be used, the number of layers in the hard mask stack quickly becomes unpractical. The challenge is now to enable the patterning of these interruptions, even when more than one lithographic mask must be used, without having to increase the number of layers in the hard mask stack in line with the number of layers required to define the trench interruptions.

SUMMARY OF THE INVENTION

Improved methods for blocking trench portions during fabrication of a semiconductor device, and semiconductor devices incorporating blocked trench portions, are provided.

It is an advantage of certain embodiments that trench portions of well-defined position and dimension can be blocked. The blocking of a trench portion creates two new trenches out of the original trench. The spacing between these two new trenches is determined by the dimensions of the via. The dimensions of the via can typically be controlled with a higher accuracy than the overlay of a second trench pattern with respect to a first trench pattern. This higher accuracy allows reduction of the risk of electrical shorting when the final trench patterns get filled with metal.

It is an advantage of certain embodiments that trench portions can be blocked without increasing the number of layers in the hard mask stack. As the number of layers increase in a hard mask scheme, especially when some of these layers are not transparent (e.g. TiN or amorphous carbon), it becomes harder for a common alignment beam to identify a common reference layer at the bottom of the stack. This makes alignment to this common reference layer difficult.

One or more of the above advantages can be achieved by a method and device according to the various embodiments.

In a first aspect, a method is provided for blocking one or more portions of one or more longitudinal through-holes during manufacture of a semiconductor structure, comprising the steps of: (i) forming a stack comprising: (a) a hard mask having a thickness and comprising at least one longitudinal through-hole having a width (W), a length, and a depth corresponding to the thickness of the hard mask, and (b) a first coating filling the at least one longitudinal through-hole and coating the hard mask, wherein the first coating comprises one or more materials that can be etched selectively with respect to a second coating, (ii) etching at least a vertical via in the first coating directly above a portion to be blocked of a longitudinal through-hole in such a way as to remove the first coating (present in that portion) at least over a fraction of the depth of the longitudinal through-hole (comprising the portion), wherein the via is of lateral dimension (D) larger or equal to the width (W) of the longitudinal through-hole comprising the portion and of longitudinal dimension equal to the longitudinal dimension of the portion, (iii) filling at least partially the portion to be blocked with the second coating, thereby providing a longitudinal through hole with a blocked portion, and iv. Removing the first coating selectively with respect to the second coating from at least the one or more longitudinal through-holes in such a way as to leave in place any first coating present directly underneath the second coating.

In a second aspect, a semiconductor structure is provided comprising: a hard mask having a thickness and comprising at least one longitudinal through-hole having a width (W), a length, and a depth corresponding to the thickness of the hard mask, and a first coating filling only a fraction of the depth of the at least one longitudinal through-hole and coating the hard mask, wherein the first coating comprises one or more materials that can be etched selectively with respect to a second coating, at least one vertical via in the first coating directly above a portion of the longitudinal through-hole, the vertical via being filled with the second coating, wherein the via is of lateral dimension (D) larger or equal to the width (W) of the longitudinal through-hole and of longitudinal dimension equal to the longitudinal dimension of the portion.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

Figure 1:
FIG. 1 is a vertical cross-section view of a semiconductor device in construction wherein trenches are being formed in a hard mask.

In the different figures, the same reference signs refer to the same or analogous elements.

DESCRIPTION OF THE ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

In a first aspect, a method is provided for blocking one or more portions of one or more longitudinal through-holes during manufacture of a semiconductor structure, comprising the steps of: (i) forming a stack comprising: (a) a hard mask having a thickness and comprising at least one longitudinal through-hole having a width (W), a length, and a depth corresponding to the thickness of the hard mask, and (b) a first coating filling the at least one longitudinal through-hole and coating the hard mask, wherein the first coating comprises one or more materials that can be etched selectively with respect to a second coating, (ii) etching (at least) a vertical via in the first coating directly above a portion to be blocked of the longitudinal through-hole in such a way as to remove the first coating from the portion of the longitudinal through-hole over at least a fraction of the depth of the longitudinal through-hole, wherein the via is of lateral dimension (D) larger or equal to the width (W) of the longitudinal through-hole comprising the portion and of longitudinal dimension equal to the longitudinal dimension of the portion, (iii) filling at least partially the portion to be blocked with the second coating, thereby providing a longitudinal through hole with a blocked portion, and (iv) removing the first coating selectively with respect to the second coating from at least the one or more longitudinal through-holes in such a way as to leave in place any of the first coating present directly underneath the second coating.

The longitudinal through-hole referred to in the embodiments can typically be referred to as a trench. It is a hole which is longer than wide and which bores through the entire thickness of the hard mask. The hard mask will typically have more than one such trench. They are typically disposed parallel to each other. They are typically placed at regular interval following a certain pitch. In embodiments, the hard mask may comprise two or more parallel longitudinal through-holes disposed with a pitch of less than 45 nm, for instance 30-44 nm. The pitch is defined as being the distance between a longitudinal side of a longitudinal through-hole and the corresponding longitudinal side of a neighboring longitudinal through-hole. The pitch is therefore equal to the distance between two holes plus the width of a hole.

In embodiments, the one or more longitudinal through-holes may have a width (W) of less than 25 nm, for instance 10-24 nm.

In a method of the embodiments, the trenches in the hard mask are typically longer than required for the particular envisioned connection scheme. Hence, the blocking of portions of these trenches fulfils the purpose of precisely limiting the length of the trenches to the requirements of the connection scheme. The portion referred to in the embodiments is a segment of a trench along its length. It is defined by the entire width of the trench and by only part of its length. Blocking a portion means filling at least partially that trench portion so as to interrupt the trench and to prevent that portion of the trench to be ultimately transferred to any underlying layer during a subsequent deepening of the trench. Once blocked, that portion creates two new co-linear trenches out of the original trench. It is an advantage of embodiments that these two new trenches have well-defined length, determined by the position of the blocked portion. The end-result of the deepening would then be an underlying layer having trenches interrupted where the trenches of the hard mask were blocked. These trenches in the underlying layer can then be metalized to serve as connecting lines.

The hard mask can be any material that can be patterned and which pattern can be transferred into an oxide or nitride layer such as e.g. $SiO_2$ or SiN, and be removed without damaging underlying layers (e.g. by plasma or wet etch).

Preferably, the hard mask is a metallic hard mask such as a TiN hard mask or an AlN hard mask. For instance, TiN can be removed easily by plasma or wet etch.

In embodiments, the thickness of the hard mask may be from 5 to 50 nm. For instance, it can be from 10 to 30 nm.

The hard mask (5) in the stack will typically be supported by a set of layers (see reference numbers 1 to 4 in FIG. 8) comprising a substrate (1), a dielectric layer (2) overlaying the substrate (1), and an optional protective layer (which can be composed of a pattern transfer layer (3) overlying the dielectric layer (2) and an etch block layer (4) overlaying the pattern transfer layer (3) overlying the dielectric layer (2) and underlying the hard mask (5).

The first coating filling the at least one longitudinal through-hole and coating the hard mask comprises one or more materials that can be etched selectively with respect to a second coating.

In embodiments, the first coating may comprise one or more materials comprising Si—O—Si groups. In that embodiment, the second coating may advantageously comprise an organic material that can be deposited from solution such as a spin-on-carbon material.

In embodiments, the materials comprising Si—O—Si groups can be selected from silicon oxide (such as e.g. $SiO_2$) and spin-on-glass materials (SOG) (such as e.g. siloxane polymers). The advantage of spin-on-glass (SOG) materials is that they can be applied as a liquid and only later cured to form a glass. SOG and silicon oxide materials can typically be etched by the same agents.

The first coating can be made of one material (homogeneous) or of more than one material (heterogeneous).

If the first coating is homogeneous, it can for instance be a single layer of SOG material.

If the first coating is heterogeneous, it may for instance be a combination of a layer made of a first material and a layer made of a second material.

The first coating may for instance be a combination of a silicon oxide material layer (e.g. $SiO_2$ deposited by PECVD) and a spin-on-glass material layer. The first material layer (e.g. PECVD silicon dioxide) could for instance cover the hard mask but would not be present in the trenches while the second material layer (e.g. spin-on-glass material) would fill the trenches and overlay the first material. In other words, the first coating may comprise a first material layer and a second material layer, wherein the first material layer covers the hard mask but is not present in the longitudinal through-holes while the second material layer fills the longitudinal through-holes and overlays the first material layer.

In embodiments, forming the stack may comprise the steps of: (a) providing a hard mask, (b) overlaying the hard mask with a first material that can be etched selectively with respect to the second coating, (c) overlaying the first material with a patterning layer, (d) overlaying the patterning layer with a patterned photoresist comprising at least one longitudinal opening, (e) etching through the opening so as to form the at least one longitudinal through-hole in the hard mask, (f) removing the patterned photoresist and the patterning layer, thereby exposing the first material and (g) providing a second material over the first material in such a way as to fill the at least one longitudinal through-hole and cover the first material, wherein the second material can be etched selectively with respect to a second coating, and wherein the first and second materials together define the first coating.

For forming the trenches in the hard mask, an alternative to the above lithographic method where trenches are etched in the hard mask is the use of the well-known self-aligned patterning method where parallel hard mask walls (called spacers) defining the trenches are deposited on a substrate (itself typically made of a hard mask). In this alternative embodiment, the hard mask comprising at least one through-hole is formed of the spacers. In these alternative embodiments, forming the stack may comprise the steps of: (a) forming a pattern of parallel longitudinal raised features of a sacrificial material over a substrate, the features having side-walls, (b) overlaying the raised features and the substrate with a layer of hard mask material, (c) etching the layer of hard mask material in such a way as to leave it only on the sidewalls of the features, (d) removing the features of sacrificial materials, thereby leaving only the hard mask material, thereby forming a hard mask comprising longitudinal through-holes, and (e) providing a first coating on the hard mask in such a way as to fill the at least one longitudinal through-hole, wherein the first coating can be etched selectively with respect to a second coating.

In this above embodiment, the substrate may comprise a SiN top layer.

Providing the hard mask may comprise the steps of: (a1) providing the substrate, (a2) overlaying the substrate with the dielectric layer, (a3) optionally overlaying the dielectric layer with the protective layer, and (a4) overlaying the dielectric layer, or the protective layer if present, with the hard mask.

A patterned photoresist is typically provided by first providing a photoresist layer, than exposing that photoresist layer through a photolithographic mask comprising the pattern.

In embodiments, the patterning layer may comprise a spin-on-carbon overlaying the first material and a spin-on-glass overlaying the spin-on-carbon layer.

The etching step (ii) is preferably a dry etching step such as a plasma etching step.

In embodiments, the etching step (ii) may be performed in such a way as to remove the first coating over only a fraction of the depth of the longitudinal through-hole. In other words, the etching may be stopped when it reaches a fraction, e.g. the middle, of the thickness of the hard mask layer. The etching may therefore leave some of the first coating in the portion of the trench overlapping with the via. In these embodiments, step (iv) may be performed in such a way as to only leave the first coating directly underneath the second coating present in the blocked portion. These embodiments are advantageously used in combination with a first coating formed of two materials. For instance, if two materials form the first coating, the via can be etched into the second material (which can be SOG) and the first material (which can be PECVD oxide) in such a way as to leave some of the second material of the first coating in the portion of the trench overlapping the via. For instance, half of the second material of the first coating could be left in the portion of the trench overlapping the via.

In embodiments, the etching step (ii) may be performed in such a way as to remove completely the first coating from the portion. In other words, the etching may be stopped only when it reaches the layer underlying the hard mask (e.g. an etch stop layer).

In these embodiments, step (iv) may comprise completely removing the first coating selectively with respect to the second coating from at least the one or more longitudinal through-holes. This is typically performed by removing the first coating completely from the device under construction selectively with respect to the second coating (e.g. by plasma etching).

The via typically has the longitudinal dimension of the portion to be blocked.

The via is of lateral dimension (D) larger or equal to the width (W) of the longitudinal through-hole comprising the portion to be blocked. In embodiments, the lateral dimension (D) of the via is such as to only overlap the trench comprising the portion to be blocked and not any of the neighboring trenches.

In embodiments, step (ii) of etching a vertical via may comprise the steps of: overlaying the first coating with a spin-on-carbon layer, overlaying the spin-on-carbon layer with a spin-on-glass layer, providing a patterned photoresist on top of the spin-on-glass layer, wherein the patterned photoresist comprises at least one opening corresponding to the via to be etched, and etching through the opening so as to form the at least one via.

When an opening in a patterned photoresist is to correspond to the via to be etched, this implies that etching vertically through that opening would result in the via. This in turns imply that the lateral dimensions of the opening is selected so that after etching the obtained via has the wished lateral dimensions.

In embodiments, the second coating may comprise an organic material, preferably an organic material that can be deposited from solution such as a spin-on-carbon material. The spin-on-carbon material is an organic material that can be spin coated. The organic material is typically an organic polymer, i.e., a polymer having carbon atoms in its backbone chain. The organic material typically has no Si—O—Si groups.

The step (iii) of filling at least partially the portion to be blocked with the second coating can be performed in various ways.

In one embodiment, the portion may be filled with the second coating in such a way that the second coating does not cover the top surface of the first coating (i.e. the second coating does not overfill the via).

In another embodiment, the portion may be filled with the second coating in such a way that the second coating covers the top surface of the first coating material (i.e. the second coating overfill the via) but is then etched back so as to remove the second coating where it covers the top surface of the first coating.

In another embodiment, the portion may be filled with the second coating in such a way that the second coating covers the top surface of the first coating material (i.e. the second coating overfill the via). This embodiment is advantageous when more than one lithographic masks and a corresponding number of photoresists are employed to form vias.

In an embodiment, step (iii) of filling the via with the second coating may be performed in such a way as to cover the top of the first coating (i.e. the second coating overfill the via), and the method may further comprise the following steps before performing step (iv): (a) overlaying the second coating with a spin-on-glass layer, (b) providing above the spin-on-glass layer a patterned photoresist comprising an opening corresponding to another portion to be blocked of the at least one longitudinal through-hole, (c) etching a vertical via in the first coating directly above the other portion of the longitudinal through-hole in such a way as to remove the first coating from the longitudinal through-hole over at least a fraction of the depth of the longitudinal through-hole, wherein the vertical via is of lateral dimension (D) larger or equal to the width (W) of the longitudinal through-hole comprising the other portion and of longitudinal dimension equal to the longitudinal dimension of the other portion, (d) filling at least partially the other portion to be blocked with the second coating, and (e) optionally repeating steps (a) to (d) one or more times.

In embodiments, the portion may be filled with the second coating in such a way that the second coating covers completely the top surface of the first coating material.

In embodiments, in sub-step (b) of step (iii), "another portion to be blocked" may correspond to either: a further portion to be blocked of the same longitudinal through-hole comprising the portion to be blocked referred to in step (ii), or a further portion to blocked of another longitudinal through-hole than the one comprising the portion to be blocked referred to in step (ii).

In embodiments, the step (iv) of removing selectively the first coating may be performed by dry etching.

In step (iv), the expression "leaving in place any of the first coating present directly underneath the second coating" implies that: if during step (ii), the first coating was only removed over a fraction of the depth of the longitudinal through-hole, the remaining part present directly underneath the second coating and protected thereby, will not be removed in step (iv), but if during step (ii), the first coating was removed over the entire depth of the longitudinal through-hole, no first coating is present directly underneath the second coating, and no first coating will therefore been left in place after step (iv).

In embodiments, wherein the stack further comprises a substrate and optionally one or more interlayers sandwiched between the hard mask and the substrate, wherein the method further comprises after step (iv) the step (v) of deepening (non-blocked portions of) the at least one longitudinal through-hole so as to expose the substrate. In the embodiments, the non-blocked portions of the longitudinal through-holes are the portions where no first coating and/or second coating is present.

In embodiments, the substrate may comprise a conductive or semiconductive part. For instance the substrate may be formed entirely or partly from a conductive or semiconductive material. Typically, step (v) exposes a conductive part of the substrate. The substrate is typically a semiconductor substrate but other substrates such as conductive substrates can be used. The semiconductor material forming the substrate (or a part thereof) may for instance be selected from $Si_nGe_{1-n}$ wherein n is from 0 to 1, doped silicon, silicides, germanides, and III-V materials. $Si_nGe_{1-n}$ is preferred. Si is the most typical substrate.

Embodiments can be used both in middle of line (MOL) or in back-end of line (BEOL). In embodiments where the method is used in MOL, the substrate may comprise one or more device structures of the type formed during front-end of line (FEOL) processing. Examples of device structures include but are not limited to memory devices, logical devices, field effect transistors (FETs) and components thereof such as gate electrodes, source regions, and drain regions.

In embodiments, the substrate may for instance comprise a source, a drain or the top of a gate.

The one or more interlayers can comprise for instance a protective layer and a dielectric.

Some of the optional one or more interlayers present between the substrate and the hard mask may have for purpose to permit the forming in step (i) of the longitudinal through-holes in the hard mask and to permit (typically in step (v)) the removal of the hard mask without damaging the substrate. These interlayers will be herein referred as forming a protective layer. The protective layer is typically underlying the hard mask. In embodiments, the substrate may be made of a material having for general formula $Si_nGe_{1-n}$ wherein n is from 0 to 1, and a protective layer may be underlying the hard mask. The protective layer may for instance be formed of an etch block layer (typically underlying the hard mask) and a pattern transfer layer (below the etch block layer and overlying the optional dielectric). The etch block layer is a layer which is not etched by the chemistry used to etch the hard mask. The etch block layer is particularly useful when the substrate is a $Si_nGe_{1-n}$ substrate.

In embodiments, the etch block layer may be an oxide layer. The oxide layer can be for instance a silicon oxide layer or a carbon-doped silicon oxide layer (SiOC). A SiOC layer may be formed, for example, by PECVD using a gas including silicon (Si), a gas including oxygen (O), and a gas including carbon (C). The SiOC layer is typically obtainable from the PECVD of $SiH_4$ and $CO_2$. The SiOC layer contains silicon (Si), oxygen (O), and carbon (C) and may further contain a slight amount of hydrogen (H) due to the source-material gas during the CVD to form the SiOC layer overlaying the amorphous carbon layer.

The pattern transfer layer is a layer that can be etched selectively with respect to the dielectric layer and which can be removed without damaging the substrate. The pattern transfer layer can for instance be an organic layer (such as an amorphous carbon layer) or a second hard mask (such as a TiN layer).

The amorphous carbon layer is typically an organic layer deposited by chemical vapor deposition. For instance it can be an organic layer obtainable by the PECVD of $C_3H_6$. The thickness of the pattern transfer layer can for instance be from 10 nm to 50 nm or from 12 nm to 45 nm.

Other interlayers present between the substrate and the hard mask may form a dielectric above the substrate. The dielectric is typically overlying the substrate.

In embodiments, the dielectric layer may be an oxide.

In embodiment, the oxide may be a silicon oxide. The silicon oxide is preferably silicon dioxide. For instance, it can be deposited by PECVD.

The thickness of the dielectric layer may for instance be from 50 to 200 nm, or from 60 to 160 nm.

In embodiments where the method is used in BEOL, the dielectric can for instance comprise a low-k dielectric.

In a second aspect, the method refers to a semiconductor structure comprising: a hard mask having a thickness and comprising at least one longitudinal through-hole having a width (W), a length, and a depth corresponding to the thickness of the hard mask, and a first coating overlaying the hard mask, wherein the first coating comprises one or more materials that can be etched selectively with respect to a second coating, at least one vertical via in the first coating directly above a portion of the longitudinal through-hole, the vertical via being filled with the second coating, wherein the via is of lateral dimension (D) larger or equal to the width (W) of the longitudinal through-hole and of longitudinal dimension equal to the longitudinal dimension of the portion.

In embodiments, the first coating may be partially filling the depth of the at least one longitudinal through-hole in addition to overlaying the hard mask.

In embodiments, the hard mask may be supported by a supporting stack. The hard mask may therefore overlay a supporting stack comprising: a substrate, a dielectric layer overlaying the substrate, and an optional protective layer overlaying the dielectric layer.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims.

Reference will be made to transistors. These are three-terminal devices having a first main electrode such as a drain, a second main electrode such as a source and a control electrode such as a gate for controlling the flow of electrical charges between the first and second main electrodes.

Figure 19:
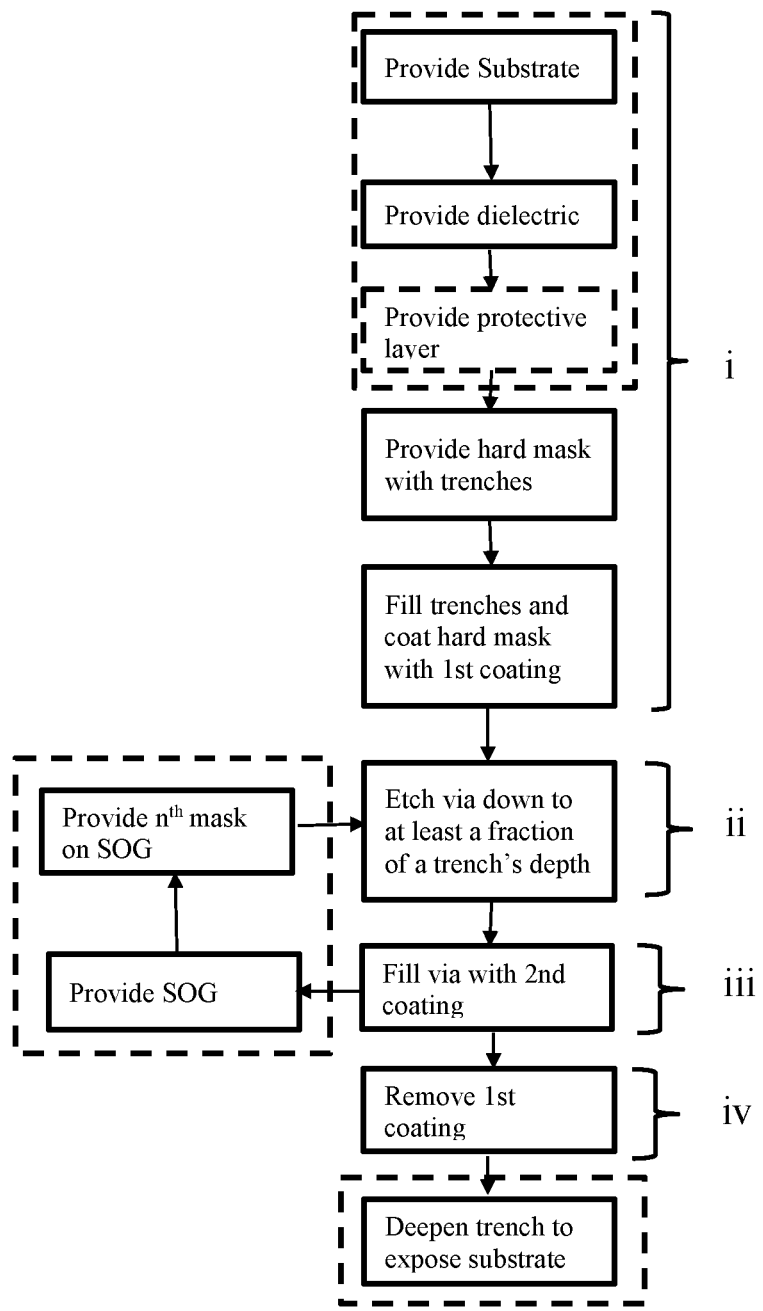
FIG. 19 is a flowchart showing embodiments.

FIG. 19 summarize the various steps of the method of the first aspect. Optional steps are surrounded by dashed lines.

Example 1: Formation of a Longitudinal Through Hole in a TiN Layer

A bare 300 mm silicon wafer (1) compatible for 193 nm immersion (193i) lithography and regular processing was introduced in a cleanroom (see FIG. 1).

Figure 2:
FIG. 2 is a vertical cross-section view of a semiconductor device in construction wherein trenches are being formed in a hard mask.

Referring to FIG. 2. To mimic a Pre Metal Dielectric (PMD), 150 nm of silicon dioxide (2) was deposited by Plasma Enhanced Chemical Vapor Deposition (PECVD) at 400° C. on the substrate (1). A Chemical Mechanical Planarization (CMP) step was applied on this oxide (2) to reduce it to the thickness of 120 nm. In regular flows a CMP step is carried out to reduce topography. In this example, we used a CMP step to ensure a flat PECVD oxide (2). It has been observed that oxide (2) showed surface roughness after deposition. In case of a flat PECVD oxide (2), the CMP step could be omitted. The PECVD oxide (2) was deposited in a Producer SA chamber from Applied Materials. It is a dual chamber and commonly used precursors were used i.e. $SiH_4$ and $N_2O$.

Figure 3:
FIG. 3 is a vertical cross-section view of a semiconductor device in construction wherein trenches are being formed in a hard mask.

Referring to FIG. 3. On top of the 120 nm PECVD oxide (2), a 35 nm amorphous carbon layer (3) was deposited at 400° C. The type of amorphous carbon layer (3) is not critical as long as it is suitable for use as a patterning substrate. As precursors $C_3H_6$ with Ar/He as the carrier gas was used. The amorphous carbon layer used (3) is also known as "Advanced Patterning Film" or APF.

Figure 4:
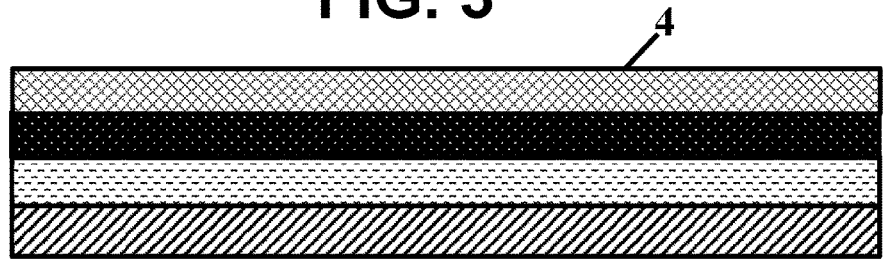
FIG. 4 is a vertical cross-section view of a semiconductor device in construction wherein trenches are being formed in a hard mask.

Referring to FIG. 4. On top of the amorphous carbon layer (3), a 15 nm SiOC layer (4) was deposited at 350° C. As precursors, $SiH_4$ with $CO_2$ were used. The amorphous carbon layer (3) and SiOC layer (4) were deposited in the same chamber as used for the PECVD step. The SiOC layer (4) will serve as an etch block (protective) layer during patterning of the TiN hard mask layer (5). Other etch block layers could have been used here such as a silicon oxide layer for instance.

Figure 5:
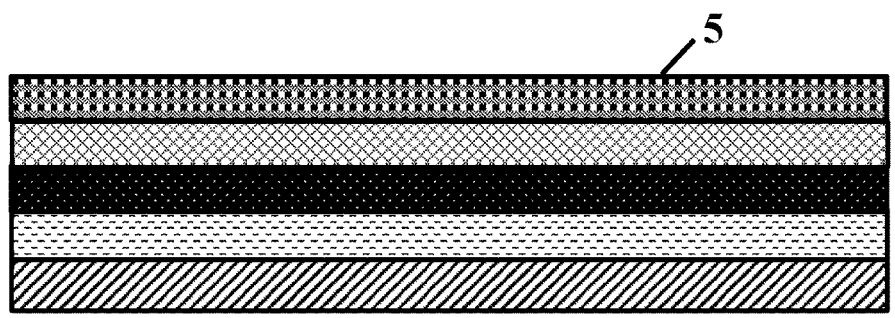
FIG. 5 is a vertical cross-section view of a semiconductor device in construction wherein trenches are being formed in a hard mask.

Referring to FIG. 5. A 20 nm TiN layer (5) was sputtered on top of the SiOC layer (4). A tool from Canon-Anelva called C-7100GT was used to that effect. The sputtering occurred at room temperature.

Figure 6:
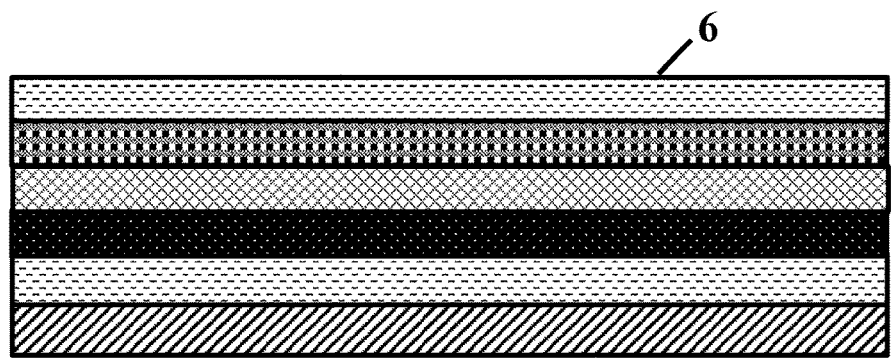
FIG. 6 is a vertical cross-section view of a semiconductor device in construction wherein trenches are being formed in a hard mask.

Referring to FIG. 6. On top of the TiN layer (5), 25 nm of a second PECVD silicon oxide layer (6) was deposited at 400° C.

Figure 7:
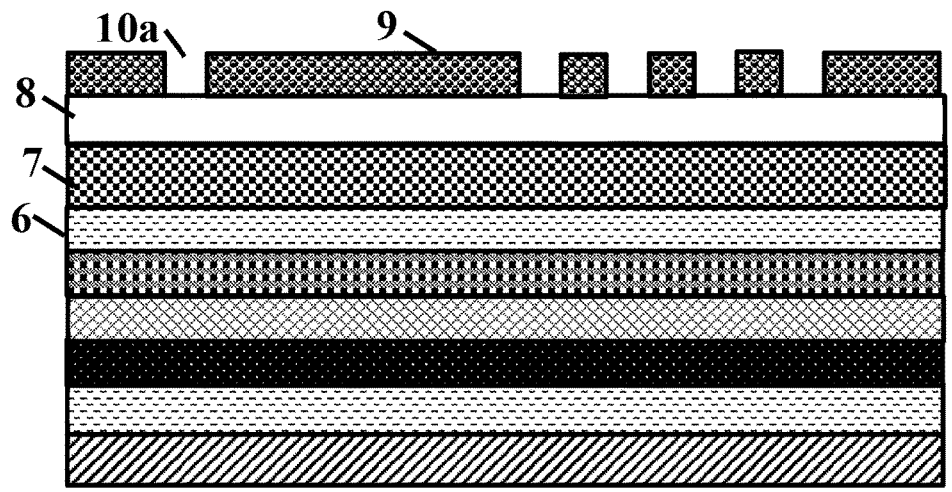
FIG. 7 is a vertical cross-section view of a semiconductor device in construction wherein trenches are being formed in a hard mask.

Referring to FIG. 7. On top of the oxide (6), 100 nm Spin-On-Carbon (SOC) (7) and 28 nm Spin-On-Glass (SOG) (8) were spun. The layer composed of the SOC (7) and the SOG (8) acts as a patterning layer (7, 8) for a 193i lithography. SOG/SOC are products from JRS micro called respectively ISX302 and HM710.

A 193i lithography print (9) was then provided on top of the SOC (7)/SOG (8) layer. In the next step, the print (9) will be used as a mask to form longitudinal through-holes (10b) (i.e. trenches (10b)) in the TiN layer (5). The print defined trenches separated from each other by a distance of 80 nm.

Figure 8:
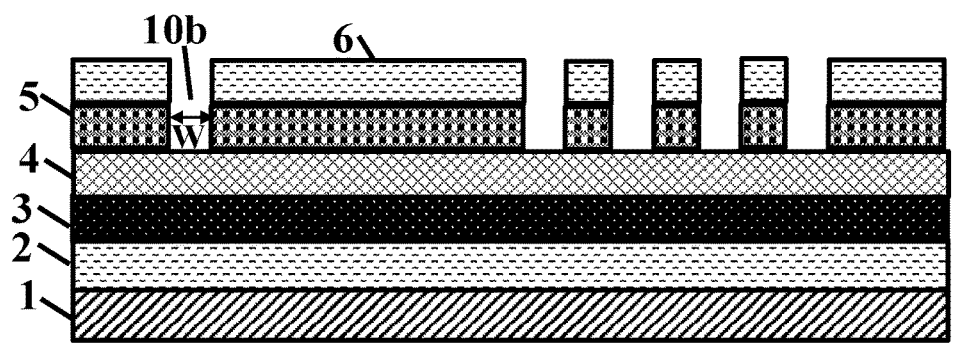
FIG. 8 is a vertical cross-section view of a semiconductor device in construction wherein trenches are being formed in a hard mask.

Referring to FIG. 8. The print was then transferred into the oxide (6) and TiN (5) layer by means of dry etching through the print (9). The etching stopped on the 15 nm SiOC layer (4), and at the end of the etch, the SOG (8)/SOC (7) layers were completely removed. Actually, SOG (8) was first etched through the print (9), next during the SOC (7) etch, the 193 resist on top of the SOG (8) was removed. During the 25 nm oxide (6) etch, the SOG (8) was removed. The SOC (7) was stripped after the TiN (5) etch. In the present example, only one print was used. However to obtain pitches (i.e. inter-trenches distance) smaller than 80 nm in the TiN (5), the steps of providing the patterning layer (7, 8), providing the 193i lithography print (9) and etching down to the SiOC layer (4) can be repeated one or more times. This is done typically one time by placing the second 193i lithography print (not depicted) by half a pitch perpendicularly to the longitudinal direction of the trench features (10a) of the print (9), thereby providing trenches (10b) in the TiN (5) which are twice closer than after the first etch (in this case with a pitch of 40 nm). The etching was carried out in a Kiyo chamber from Lam research. The etching gases were selected amongst usual etching gases such $CF_4$, $CH_2F_2$, $SF_6$, $N_2$, $O_2$, Ar, and $Cl_2$ according to the knowledge of the person skilled in the art for their ability to etch the material to be etched.

Example 2: Blocking of a Portion of the Longitudinal Through-Hole Obtained in Example 1

Figure 9:
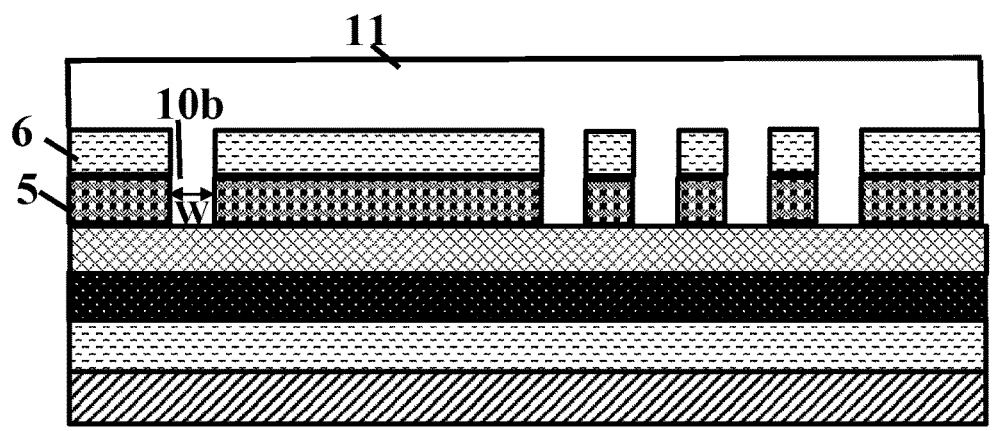
FIG. 9 is a vertical cross-section view of a semiconductor device in construction wherein a trench is being blocked according to an embodiment.

Referring to FIG. 9. 40 nm SOG (11) was spun on the patterned layer (6, 5). The SOG (11) filled up the pattern in the oxide (6)/TiN (5) and planarized the topography.

Figure 10:
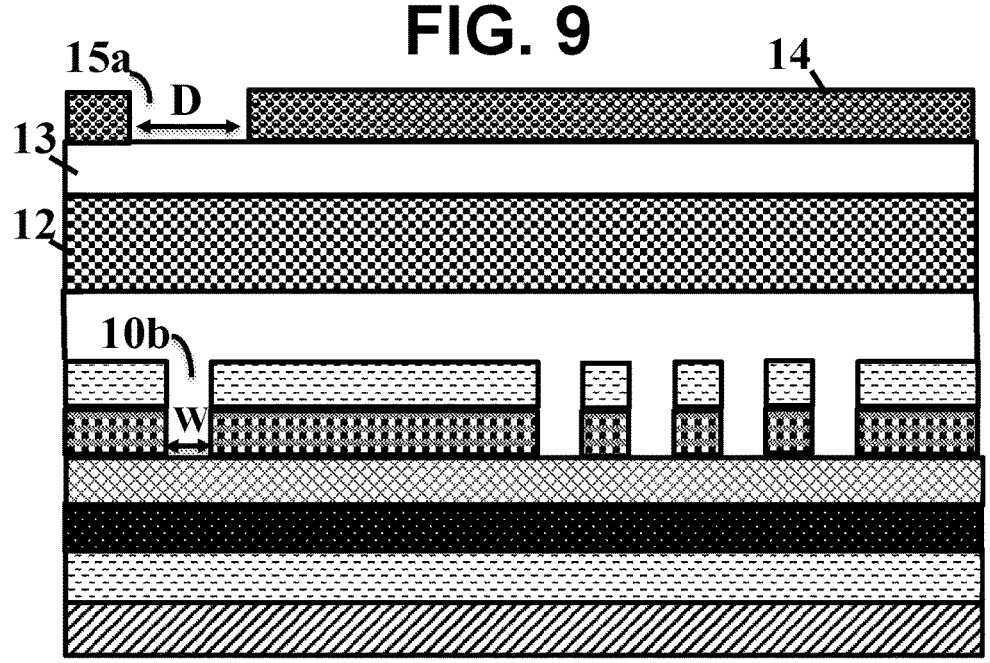
FIG. 10 is a vertical cross-section view of a semiconductor device in construction wherein a trench is being blocked according to an embodiment.

Referring to FIG. 10. A 100 nm SOC (12)/28 nm SOG (13) layer was spun on top of the 40 nm SOG (11). A 193i lithography print (14) was deposited on top of the SOG layer (13). The print (14) (i.e., photoresist mask (14)) was defined in such way that its opening (15) defining the lateral extents of the etching, corresponded to the positions on the trenches (10b) that needed to be blocked. In practiced, the print (14) defined a circular opening (15) of diameter (D) exceeding the width (W) of the longitudinal through-hole (10b). At that stage, a tone inversion was carried out as follows.

Figure 11:
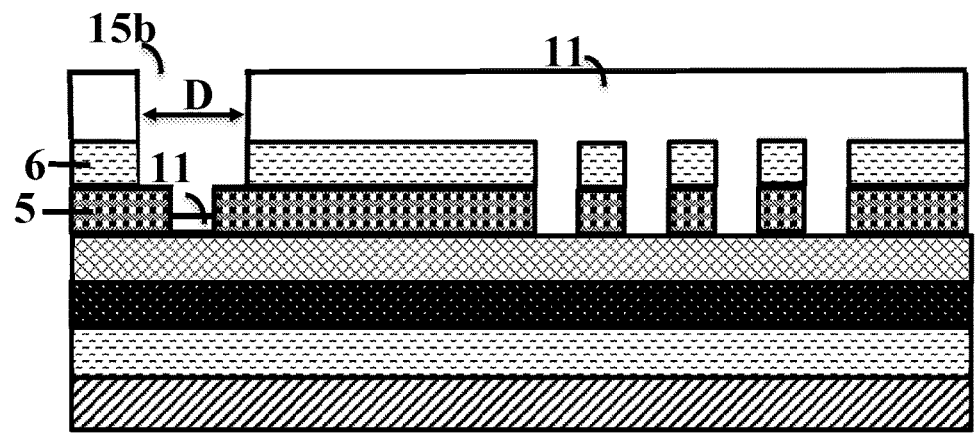
FIG. 11 is a vertical cross-section view of a semiconductor device in construction wherein a trench is being blocked according to an embodiment.

Referring to FIG. 11. By means of a dry etch, the pattern of the print (14) was transferred into the 40 nm SOG (11) and the 25 nm PECVD oxide (6). The etching was stopped when it reached the middle of the TiN layer (5) thickness, thereby leaving some SOG (11) in the portion of the trench (10b) overlapping with the via. The SOG (13)/SOC (12) layers were removed during the etching step as described before. The etch was carried out in a Flex El chamber from Lam research using standard fluorocarbon, $N_2$, $O_2$, and Ar etch gases.

Figure 12:
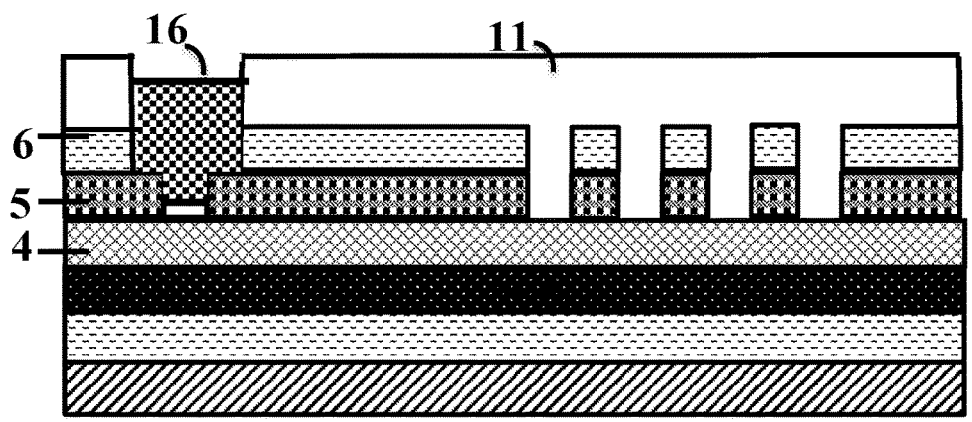
FIG. 12 is a vertical cross-section view of a semiconductor device in construction wherein a trench is being blocked according to an embodiment.

Referring to FIG. 12. A SOC material (16) was spin coated on the structure and filled the etched areas. The SOC material (16) was etched back so as to expose the SOG layer (11). The etch back was carried out on endpoint in a Kiyo chamber from Lam using regular chemistries for etching of organic materials. That chemistry is not critical and $O_2$, $N_2$, and/or Ar can be used.

Figure 13:
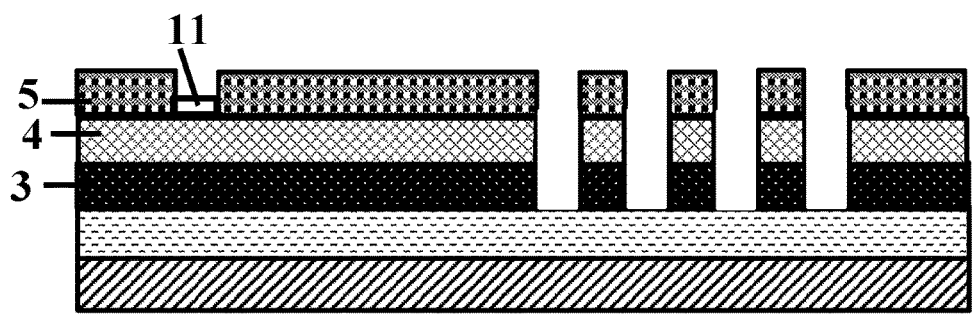
FIG. 13 is a vertical cross-section view of a semiconductor device in construction wherein a trench is being blocked according to an embodiment.

Referring to FIG. 13. The SOG layer (11) and the PECVD oxide (6) were etched back selectively to SOC (12) and TiN (5). Etching was carried out in a Flex El chamber from Lam research. The chemistry chosen was $C_4F_6/O_2/Ar$. The ratio was selected so as to achieve selectivity to the SOC (12). At the positions where the trenches were present, the underlying SiOC (4) was removed as well. Finally, during the dry etch step, the chemistry was changed to etch the amorphous carbon layer (3) and blocking SOC (16) at the same time, selective to TiN (5) and oxide (6). This was done using $N_2/H_2/O_2$ based chemistries.

Figure 14:
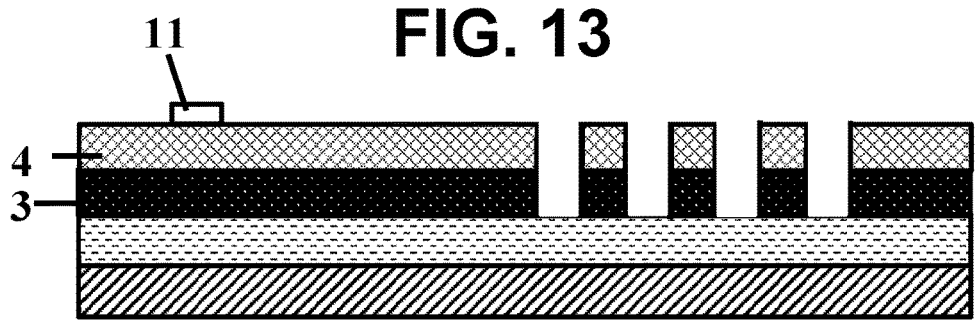
FIG. 14 is a vertical cross-section view of a semiconductor device in construction wherein a trench is being blocked according to an embodiment.

Referring to FIG. 14. In the following step, we removed the TiN (5) by using an aqueous ammonium peroxide mixture (APM).

Figure 15:
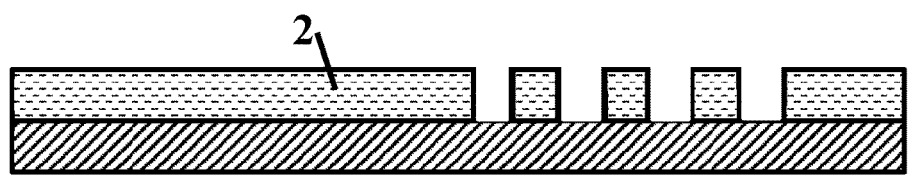
FIG. 15 is a vertical cross-section view of a semiconductor device in construction wherein a trench is being blocked according to an embodiment.
Figure 16:
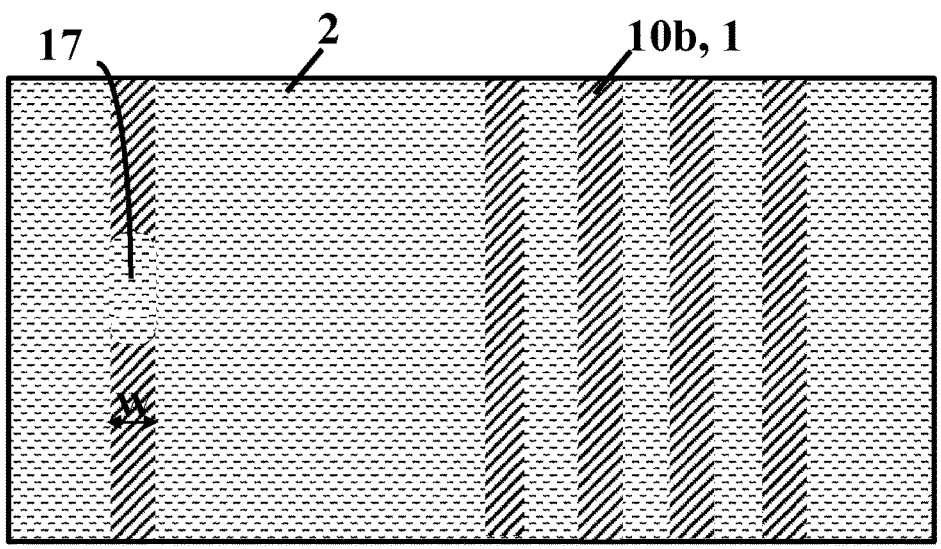
FIG. 16 is a plan view of FIG. 15.
Figure 17:
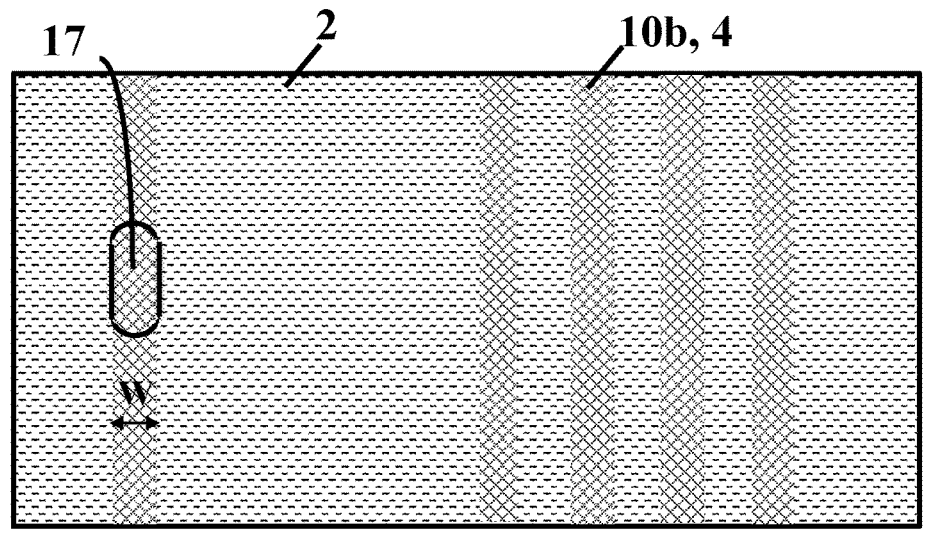
FIG. 17 is a plan view of FIG. 8.

Referring to FIGS. 15 and 16. Finally, an oxide (4, 6) etch is carried out in a Flex Fl chamber from Lamresearch using standard fluorocarbon based chemistries. The top oxides (4, 6) are removed during this step and at the end the amorphous carbon layer (3) is stripped. FIG. 16 shows a top view of the obtained structure where the blocked portion (17) of the trench (10b) is visible.

Figure 18:
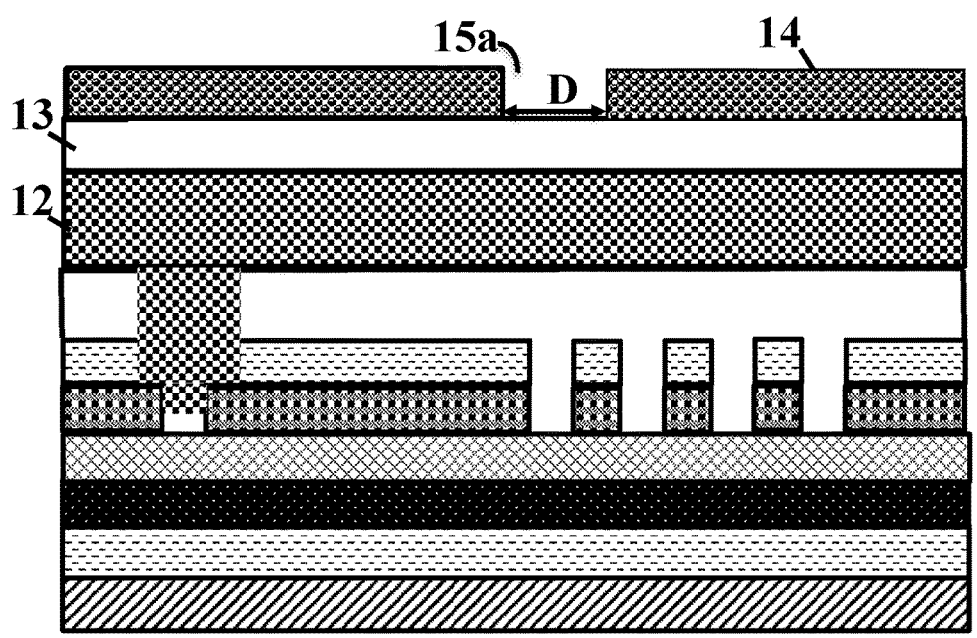
FIG. 18 is a vertical cross-section of a semiconductor device in construction wherein a first step in the blocking of a second trench is being performed according to an embodiment.

A variant permitting the use of multiple masks operates as follow. In the situation of FIG. 11, instead of only filling the etched area with a SOC material (16), the SOC material can be provided in such a way that it not only covers the etched area but that it also covers the SOG layer (11) so as to form a 100 nm thick layer over that layer. A new 28 nm SOG layer can then be coated on the SOC material (16) and another 193i lithography print (14) can then be deposited on top of the new 28 nm SOG layer (13). The print (14) can off course here also be defined in such way that its opening (15a) defining the lateral extends of the etching corresponds to the new positions on the trenches (10b) that needed to be blocked. The resulting structure is represented in FIG. 18. The procedure described in reference to FIG. 11 and following can then be applied.

Figure 20:
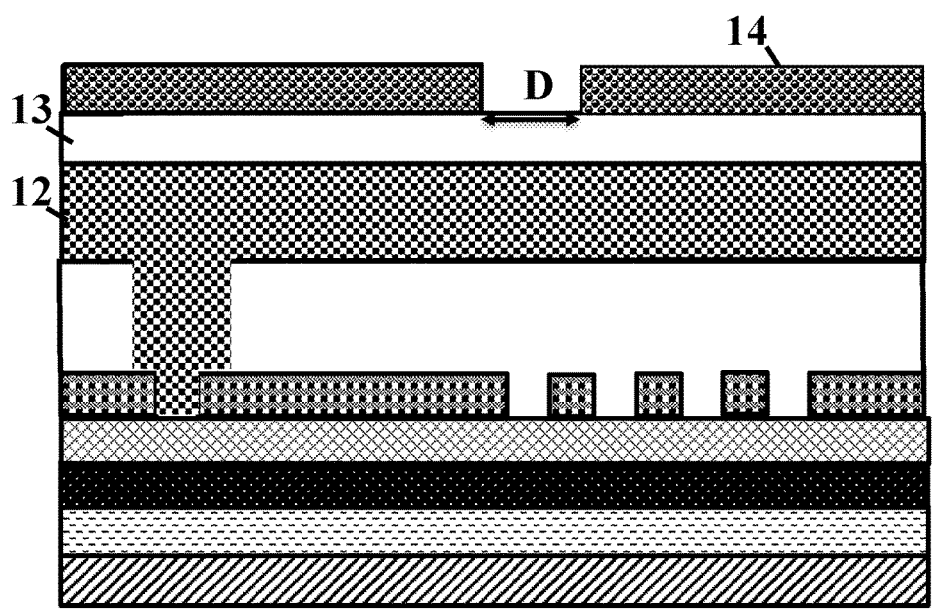
FIG. 20 is a vertical cross-section of a semiconductor device in construction at a stage analogue to FIG. 18 but according to another embodiment.
Figure 21:
FIGS. 21-35 depict a modification of the vertical cross-section view of a semiconductor device in construction depicted in FIGS. 1-15. In the depiction of FIGS. 21-35, after the first coating (11) is selectively removed, the at least one longitudinal through-hole (10b) is deepened so as to expose the substrate (1) (see FIG. 31).
Figure 22:
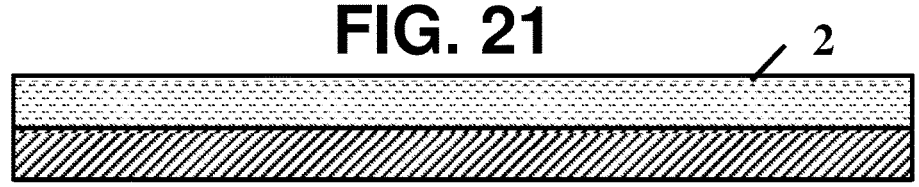
Figure 23:
Figure 24:
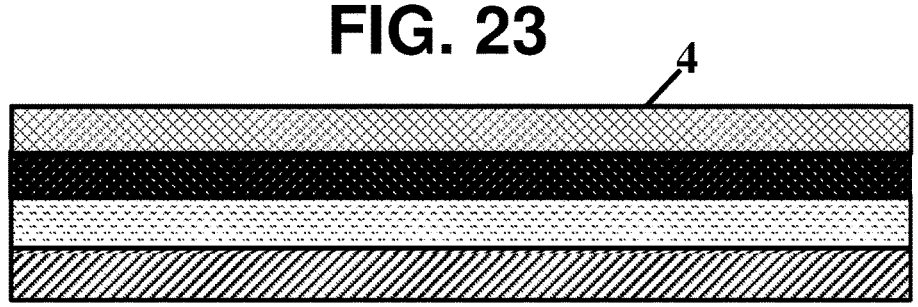
Figure 25:
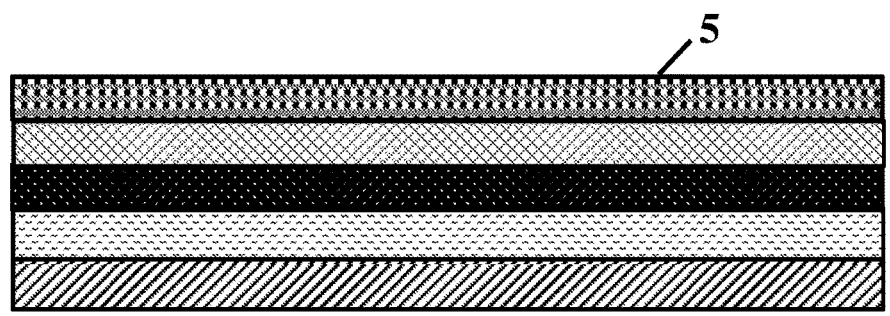
Figure 26:
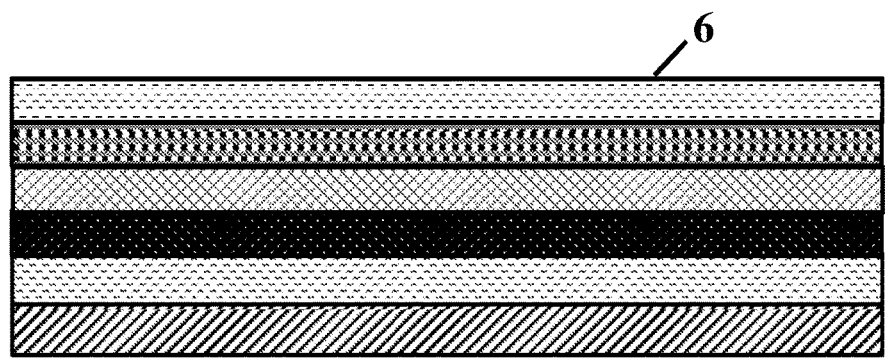
Figure 27:
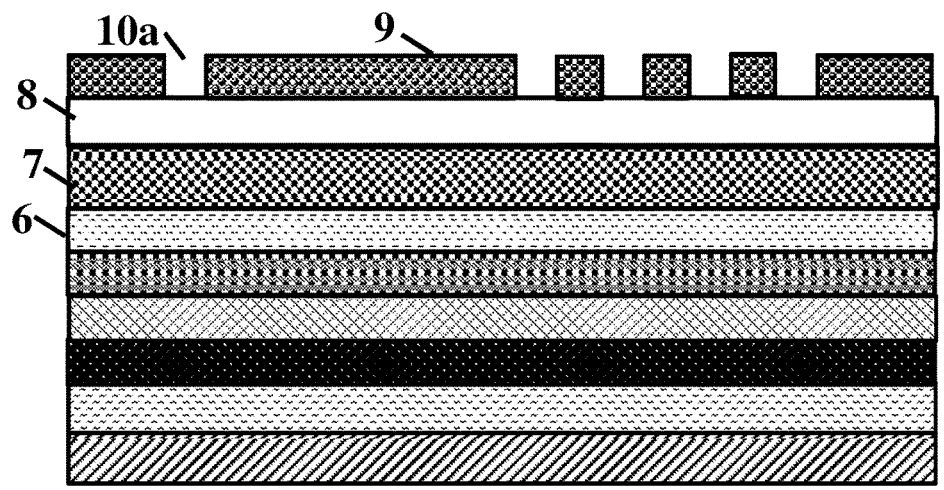
Figure 28:
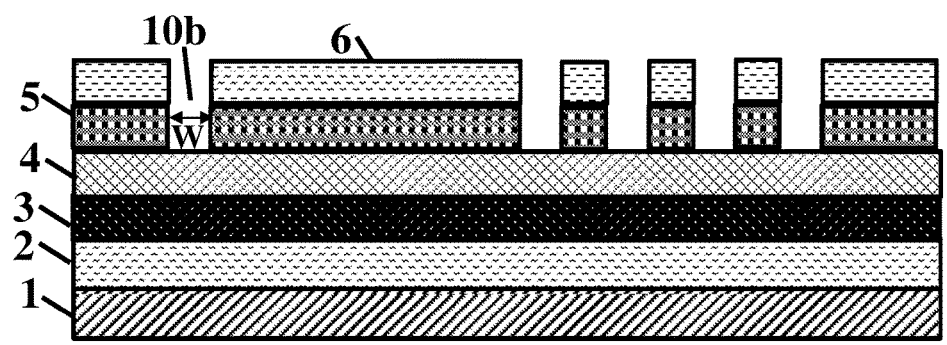
Figure 29:
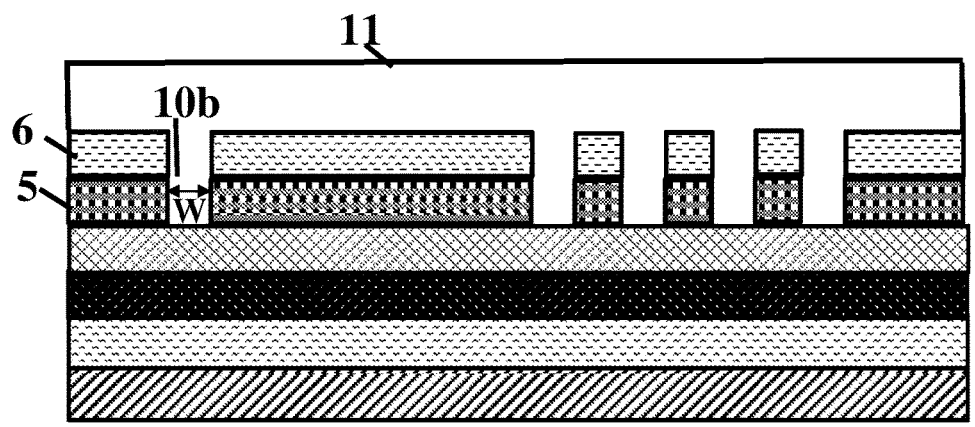
Figure 30:
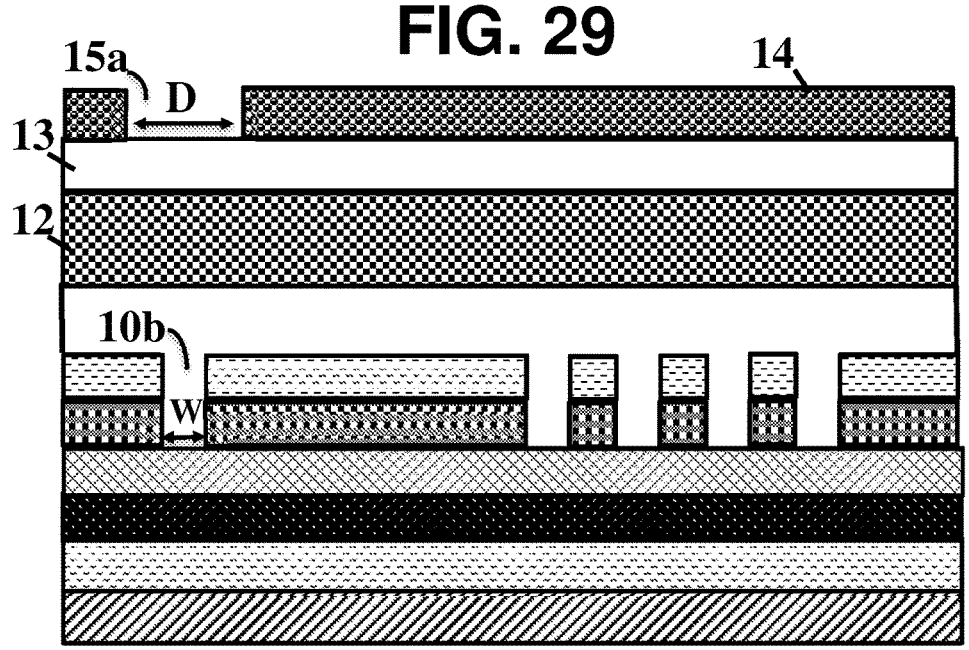
Figure 31:
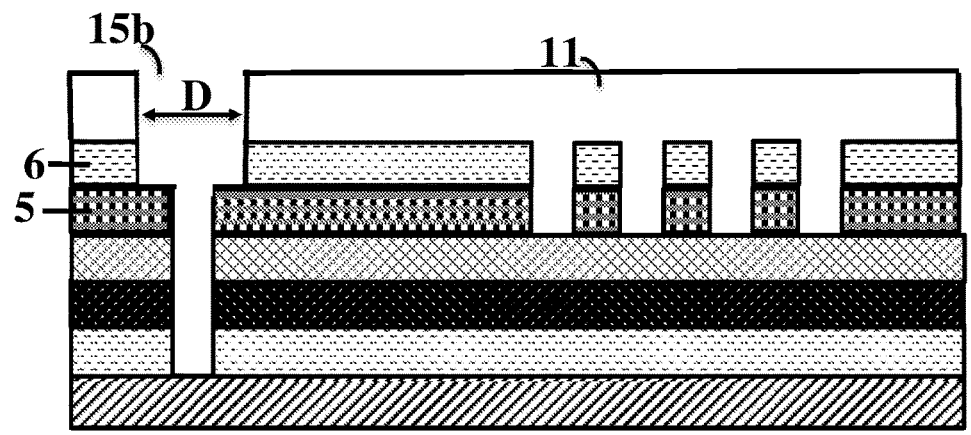
Figure 32:
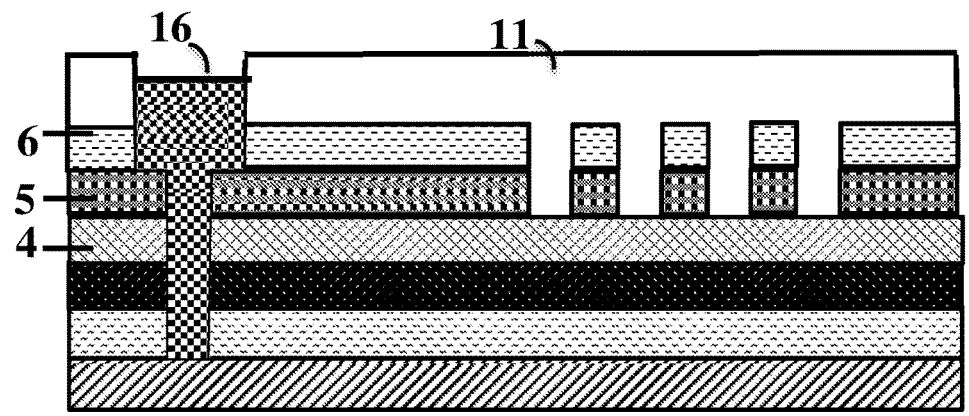
Figure 33:
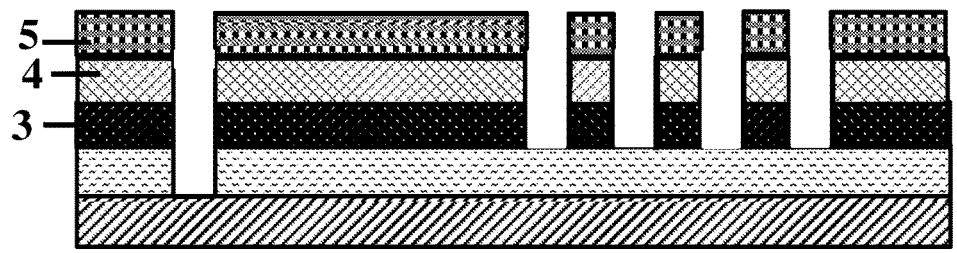
Figure 34:
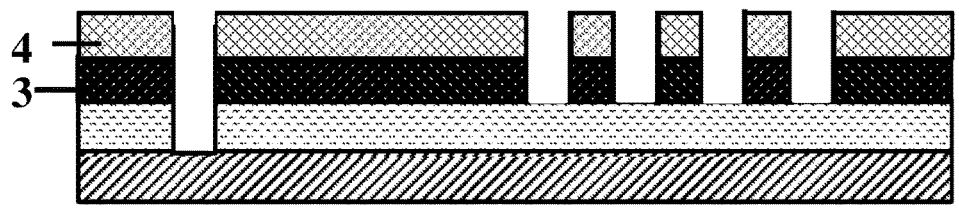
Figure 35:
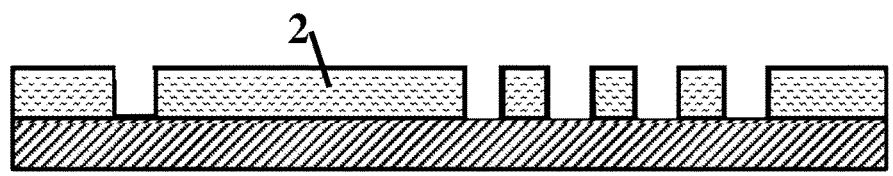

Example 3: Formation of a Longitudinal Through Hole in a TiN Layer and Blocking of a Portion of the Longitudinal Through-Hole Wherein the First Coating is Formed of a Single Material Examples 1 and 2 were repeated except that the substrate (1) comprised a conductive line, that the dielectric layer (2) was formed of a SiCO/SiCN passivation layer, a 65 nm low-k dielectric layer and an oxide capping layer, that the protective layer (3, 4) was formed of a 15 nm TiN (3) and a SiN (4) layer, and that the first coating was formed of a single layer of SOG material (11). An intermediate structure corresponding is shown in FIG. 20.

It is to be understood that although preferred embodiments, specific constructions and configurations, as well as materials, have been discussed herein for devices according to the present invention, various changes or modifications in form and detail may be made without departing from the scope and spirit of this invention. For example, any formulas given above are merely representative of procedures that may be used. Functionality may be added or deleted from the block diagrams and operations may be interchanged among functional blocks. Steps may be added or deleted to methods described within the scope of the present invention.

All references cited herein are incorporated herein by reference in their entirety. To the extent publications and patents or patent applications incorporated by reference contradict the disclosure contained in the specification, the specification is intended to supersede and/or take precedence over any such contradictory material.

Unless otherwise defined, all terms (including technical and scientific terms) are to be given their ordinary and customary meaning to a person of ordinary skill in the art, and are not to be limited to a special or customized meaning unless expressly so defined herein. It should be noted that the use of particular terminology when describing certain features or aspects of the disclosure should not be taken to imply that the terminology is being re-defined herein to be restricted to include any specific characteristics of the features or aspects of the disclosure with which that terminology is associated. Terms and phrases used in this application, and variations thereof, especially in the appended claims, unless otherwise expressly stated, should be construed as open ended as opposed to limiting. As examples of the foregoing, the term 'including' should be read to mean 'including, without limitation,' 'including but not limited to,' or the like; the term 'comprising' as used herein is synonymous with 'including,' 'containing,' or 'characterized by,' and is inclusive or open-ended and does not exclude additional, unrecited elements or method steps; the term 'having' should be interpreted as 'having at least;' the term 'includes' should be interpreted as 'includes but is not limited to;' the term 'example' is used to provide exemplary instances of the item in discussion, not an exhaustive or limiting list thereof; adjectives such as 'known', 'normal', 'standard', and terms of similar meaning should not be construed as limiting the item described to a given time period or to an item available as of a given time, but instead should be read to encompass known, normal, or standard technologies that may be available or known now or at any time in the future; and use of terms like 'preferably,' 'preferred,' 'desired,' or 'desirable,' and words of similar meaning should not be understood as implying that certain features are critical, essential, or even important to the structure or function of the invention, but instead as merely intended to highlight alternative or additional features that may or may not be utilized in a particular embodiment of the invention. Likewise, a group of items linked with the conjunction 'and' should not be read as requiring that each and every one of those items be present in the grouping, but rather should be read as 'and/or' unless expressly stated otherwise. Similarly, a group of items linked with the conjunction 'or' should not be read as requiring mutual exclusivity among that group, but rather should be read as 'and/or' unless expressly stated otherwise.

Where a range of values is provided, it is understood that the upper and lower limit, and each intervening value between the upper and lower limit of the range is encompassed within the embodiments.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. The indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Furthermore, although the foregoing has been described in some detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention.

What is claimed is:

1. A method for blocking one or more portions of one or more longitudinal through-holes during manufacture of a semiconductor structure, comprising:

forming a stack comprising:
a hard mask having a thickness and comprising at least one longitudinal through-hole having a width, a length, and a depth corresponding to the thickness of the hard mask, and
a first coating filling the at least one longitudinal through-hole and coating the hard mask, wherein the first coating comprises one or more materials that can be etched selectively with respect to a second coating;

etching at least one vertical via in the first coating directly above a first portion to be blocked of one of the at least one longitudinal through-hole so as to remove the first coating from the first portion to be blocked of the longitudinal through-hole over at least a fraction of the depth of the longitudinal through-hole, wherein the at least one vertical via is of a lateral dimension larger than or equal to the width of the longitudinal through-hole comprising the first portion to be blocked and of a longitudinal dimension equal to a longitudinal dimension of the first portion to be blocked;

overlaying the second coating with a spin-on-glass layer;

providing, above the spin-on-glass layer, a patterned photoresist comprising an opening corresponding to an other portion to be blocked of the at least one longitudinal through-hole;

etching a vertical via in the first coating directly above the other portion to be blocked of the longitudinal through-hole so as to remove the first coating from the longitudinal through-hole over at least a fraction of the depth of the longitudinal through-hole, wherein the vertical via is of a lateral dimension larger than or equal to a width of the other portion to be blocked of the at least one longitudinal through-hole and of a longitudinal dimension equal to a longitudinal dimension of the other portion to be blocked of the at least one longitudinal through-hole; and filling, at least partially, the other portion to be blocked of the at least one longitudinal through-hole with the second coating;

filling, at least partially, the first portion to be blocked with the second coating in such a way as to cover the top of the first coating, thereby providing a longitudinal through hole with a blocked first portion; and removing the first coating selectively with respect to the second coating from at least the one or more longitudinal through-holes so as to leave in place any of the first coating present directly underneath the second coating.

2. The method of claim 1, wherein the etching the at least one vertical via is performed so as to remove the first coating over only a fraction of the depth of the longitudinal through-hole, and wherein the removing the first coating selectively is performed in such a way as to only leave the first coating directly underneath the second coating present in the blocked first portion.

3. The method of claim 2, wherein the first coating comprises a first material layer and a second material layer, wherein the first material layer covers the hard mask but is not present in the longitudinal through-holes while the second material layer fills the longitudinal through-holes and overlays the first material layer.

4. The method of claim 1, wherein the removing the first coating selectively is performed by dry etching.

5. The method of claim 1, wherein the hard mask comprises TiN.

6. The method of claim 1, wherein the first coating comprises one or more materials comprising Si—O—Si groups and wherein the second coating comprises a spin-on-carbon material.

7. The method of claim 1, wherein the at least one longitudinal through-hole comprises two or more parallel longitudinal through-holes disposed with a pitch of less than 45 nm.

8. The method of claim 1, wherein the at least one longitudinal through-hole has a width of less than 25 nm.

9. The method of claim 1, wherein the etching the at least one vertical via comprises:
    overlaying the first coating with a spin-on-carbon layer;
    overlaying the spin-on-carbon layer with a spin-on-glass layer;
    providing, above the spin-on-glass layer, a patterned photoresist comprising at least one opening corresponding to the at least one vertical via to be etched; and
    etching through the at least one opening so as to form the at least one vertical via.

10. The method of claim 1, comprising repeating the steps of overlaying, providing, etching and filling one or more times.

11. A method for blocking one or more portions of one or more longitudinal through-holes during manufacture of a semiconductor structure, comprising:
    forming a stack comprising:
        a hard mask having a thickness and comprising at least one longitudinal through-hole having a width, a length, and a depth corresponding to the thickness of the hard mask, and
        a first coating filling the at least one longitudinal through-hole and coating the hard mask, wherein the first coating comprises one or more materials that can be etched selectively with respect to a second coating;
    etching at least one vertical via in the first coating directly above a first portion to be blocked of one of the at least one longitudinal through-hole so as to remove the first coating from the first portion to be blocked of the longitudinal through-hole over at least a fraction of the depth of the longitudinal through-hole, wherein the at least one vertical via is of a lateral dimension larger than or equal to the width of the longitudinal through-hole comprising the first portion to be blocked and of a longitudinal dimension equal to a longitudinal dimension of the first portion to be blocked;
    partially filling the first portion to be blocked with the second coating, thereby providing a longitudinal through hole with a blocked first portion; and
    removing the first coating selectively with respect to the second coating from at least the one or more longitudinal through-holes so as to leave in place any of the first coating present directly underneath the second coating.

12. A method for blocking one or more portions of one or more longitudinal through-holes during manufacture of a semiconductor structure, comprising:
    forming a stack comprising:
        a hard mask having a thickness and comprising at least one longitudinal through-hole having a width, a length, and a depth corresponding to the thickness of the hard mask, and
        a first coating filling the at least one longitudinal through-hole and coating the hard mask, wherein the first coating comprises one or more materials that can be etched selectively with respect to a second coating;
    etching at least one vertical via in the first coating directly above a first portion to be blocked of one of the at least one longitudinal through-hole so as to remove the first coating from the first portion to be blocked of the longitudinal through-hole over a fraction of the depth of the longitudinal through-hole, leaving in place a portion of the first coating at a bottom of the longitudinal through-hole, wherein the at least one vertical via is of a lateral dimension larger than or equal to the width of the longitudinal through-hole comprising the first portion to be blocked and of a longitudinal dimension equal to a longitudinal dimension of the first portion to be blocked;
    filling, at least partially, the first portion to be blocked with the second coating, the second coating covering the portion of the first coating at the bottom of the longitudinal through-hole, thereby providing a longitudinal through hole with a blocked first portion; and
    removing the first coating selectively with respect to the second coating from at least the one or more longitudinal through-holes, leaving in place the portion of the first coating at the bottom of the longitudinal through-hole and present directly underneath the second coating.

13. The method of claim 12, further comprising etching back the second coating, leaving the portion of the first coating at the bottom of the longitudinal through-hole exposed.

14. The method of claim 12, further comprising removing the hard mask to expose an oxide layer beneath the hard mask.

* * * * *